United States Patent
Bando et al.

(10) Patent No.: US 6,405,332 B1
(45) Date of Patent: Jun. 11, 2002

(54) STORAGE DEVICE AND ALTERNATE PROCESSING METHOD FOR DEFECTIVE SECTORS OF THE SAME

(75) Inventors: Kazuhiko Bando; Shinji Hiratsuka, both of Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/318,743

(22) Filed: May 26, 1999

(30) Foreign Application Priority Data

May 27, 1998 (JP) .......................................... 10-145714

(51) Int. Cl.[7] .............................................. G11C 29/00
(52) U.S. Cl. ...................................... 714/723; 714/710
(58) Field of Search ................................. 714/710, 711, 714/723; 369/32, 47.1, 53.15, 53.16, 53.17, 25.3

(56) References Cited

U.S. PATENT DOCUMENTS

| | | | | |
|---|---|---|---|---|
| 4,814,903 A | * | 3/1989 | Kulakowski et al. | 360/48 |
| 5,241,531 A | * | 8/1993 | Ohno et al. | 369/275.2 |
| 5,357,381 A | * | 10/1994 | Yasuda et al. | 360/53 |
| 5,818,654 A | * | 10/1998 | Reddy et al. | 360/53 |
| 5,848,438 A | * | 12/1998 | Nemazie et al. | 711/201 |
| 6,021,101 A | * | 2/2000 | Satoh | 369/32 |

* cited by examiner

Primary Examiner—Albert Decady
Assistant Examiner—Joseph D. Torres
(74) Attorney, Agent, or Firm—Rabin & Berdo, P.C.

(57) ABSTRACT

A storage device uses an inventive alternate processing method for accommodating defective sectors of the storage device. The storage device includes a host interface, an alternate process controller which controls the storage and transfer of user data in and among the components of the apparatus, a memory which has a user sector area, an alternate information area, and a spare sector area, and a buffer memory which may be a part of the controller. User data addressed to normal sectors of memory are stored directly in the user sector area. When user data is addressed to a defective sector, the controller performs alternate processing and temporarily stores the data in the buffer memory. A plurality of user data sectors stored in the buffer memory are then written by the controller at one time to the spare sector area of memory using address data in the alternate information area.

14 Claims, 5 Drawing Sheets

STORAGE DEVICE AND ALTERNATE PROCESSING METHOD FOR DEFECTIVE SECTORS OF THE SAME

BACKGROUND OF THE INVENTION

1. Field of the Invention

The present invention generally relates to a storage device and an alternate processing method for defective sectors of the storage device, and more particularly, the present invention relates to a non-volatile semiconductor memory with block unit erase only for performing erasure of data at the block unit level, and an alternate processing method for defective sectors of the non-volatile semiconductor memory.

This application is a counterpart of Japanese application Serial Number 145714/1998, filed May 27, 1998, the subject matter of which is incorporated herein by reference.

2. Description of the Related Art

In general, an external memory serves as an auxiliary memory for information processing equipment. The external memory has a buffer memory and a cache controller which temporarily stores data supplied from the information processing equipment, for example a host computer, for improving access speed, or which temporarily stores data during the reading of data from a memory that is being transferred to the host computer. The external memory is made up of a disk memory and a controller which controls the disk memory, and is integrated as a peripheral apparatus that is provided a peripheral controlling function by using an internal bus. Recently, a non-volatile semiconductor memory is being used for the memory. The non-volatile semiconductor memory is for example an EPROM (erasable programmable ROM) or an EEPROM (electrically erasable programmable ROM).

Further, the external memory recognizes that a sector is defective when a normal write and read to the sector can not be performed, and it writes the result to a defective sector map. For example, a magnetic disk with a capacity of 2 Gbytes may have a memory including a write area with 2000 error sectors in the defective sector map. This is a conventional alternate processing method for defective sectors. Detection of a defect is performed when the disk memory is formed or low level formatting is performed. A LBA (logical block address) is assigned for normal sectors when logical formatting is performed. Defective sectors occur when the disk memory is operated. At this time, the LBA is assigned by the logical formatting, and as a result the defective sectors are written to the defective sector map. Further, an alternate sector is provided.

It is desirable to use the sectors effectively by decreasing the number of data writing operations for an alternate processing.

SUMMARY OF THE INVENTION

An object of the present invention is to provide a storage device that can use the sectors effectively by decreasing the number of data writing operations for alternate processing.

According to one aspect of the present invention, for achieving the above object, there is provided a storage device comprising: a memory which has a user sector area, an alternate information area, and a spare sector area, the user sector area stores user data, the alternate information area stores information identifying a defective sector and an alternate sector which is alternated for the defective sector, and the spare sector area stores user data written to the defective sector; an alternate processing controller which reserves a sector of the spare sector area instead of the defective sector when the defective sector is present in the user sector area and which controls the writing of user data to all normal sectors of the user sector area; and a data storing unit which temporarily stores, when performing alternate processing, the data which is written to the defective sector; wherein the alternate processing controller stores data to the data storing unit when performing an alternate processing on data which is written to the defective sector, and transfers at one time a plurality of sector data from the data storing unit to the spare sector area.

According to another aspect of the present invention, for achieving the above object, there is provided a storage device comprising: a memory which has a user sector area, an alternate information area, and a spare sector area, the user sector area stores user data, the alternate information area stores information identifying a defective sector and an alternate sector which is alternated for the defective sector, and the spare sector area stores user data written to the defective sector; an alternate processing controller which reserves a sector of the spare sector area instead of the defective sector when the defective sector is present in the user sector area and which controls the writing of user data to all normal sectors of the user sector area; and the memory also has a temporary area for temporarily storing a block including a defective sector; wherein the alternate processing controller temporarily stores the block including the defective sector to the temporary area and stores at one time data for a plurality of defective sectors to the spare sector area.

An object of the present invention is to provide an alternate processing method for defective sectors of a storage device that can use the sectors effectively by decreasing the number of data writing operations for alternate processing.

According to one aspect of the present invention, for achieving the above object, there is provided an alternate processing method for defective sectors of a storage device comprising: providing a memory which has a user sector area, an alternate information area, and a spare sector area, the user sector area stores user data, the alternate information area stores information identifying a defective sector and an alternate sector which is alternated for the defective sector, and the spare sector area stores [an alternate] user data written to the defective sector; providing an alternate processing controller which reserves a sector of the spare sector area instead of the defective sector when the defective sector is present in the user sector area and which controls the writing of user data to all normal [all] sectors of the user sector area; temporarily storing data to a data storing unit when performing alternate processing on data which is written to the defective sector; and storing at one time a plurality of sector data from the alternate processing to the spare sector area by reading from the data storing unit.

According to another aspect of the present invention, for achieving the above object, there is provided an alternate processing method for defective sectors of a storage device comprising: providing a memory which has a user sector area, an alternate information area, and a spare sector area, the user sector area stores user data, the alternate information area stores information identifying a defective sector and an alternate sector which is alternated for the defective sector, and the spare sector stores user data written to the defective sector; providing an alternate processing controller which reserves a sector of the spare sector area instead of the defective sector when the defective sector is present in the user sector area and which controls the writing of data to all normal sectors of the user sector area; providing the memory with a temporary area for temporarily storing a block including a defective sector; temporarily storing in the temporary area the block including the defective sector; and storing at one time the data of the plurality of the defective sectors stored in the temporary area to the spare sector area.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A storage device and an alternate processing method for defective sectors of a storage device according to first and second preferred embodiments of the present invention will hereinafter be described in detail with reference to the accompanying drawings.

Figure 1:
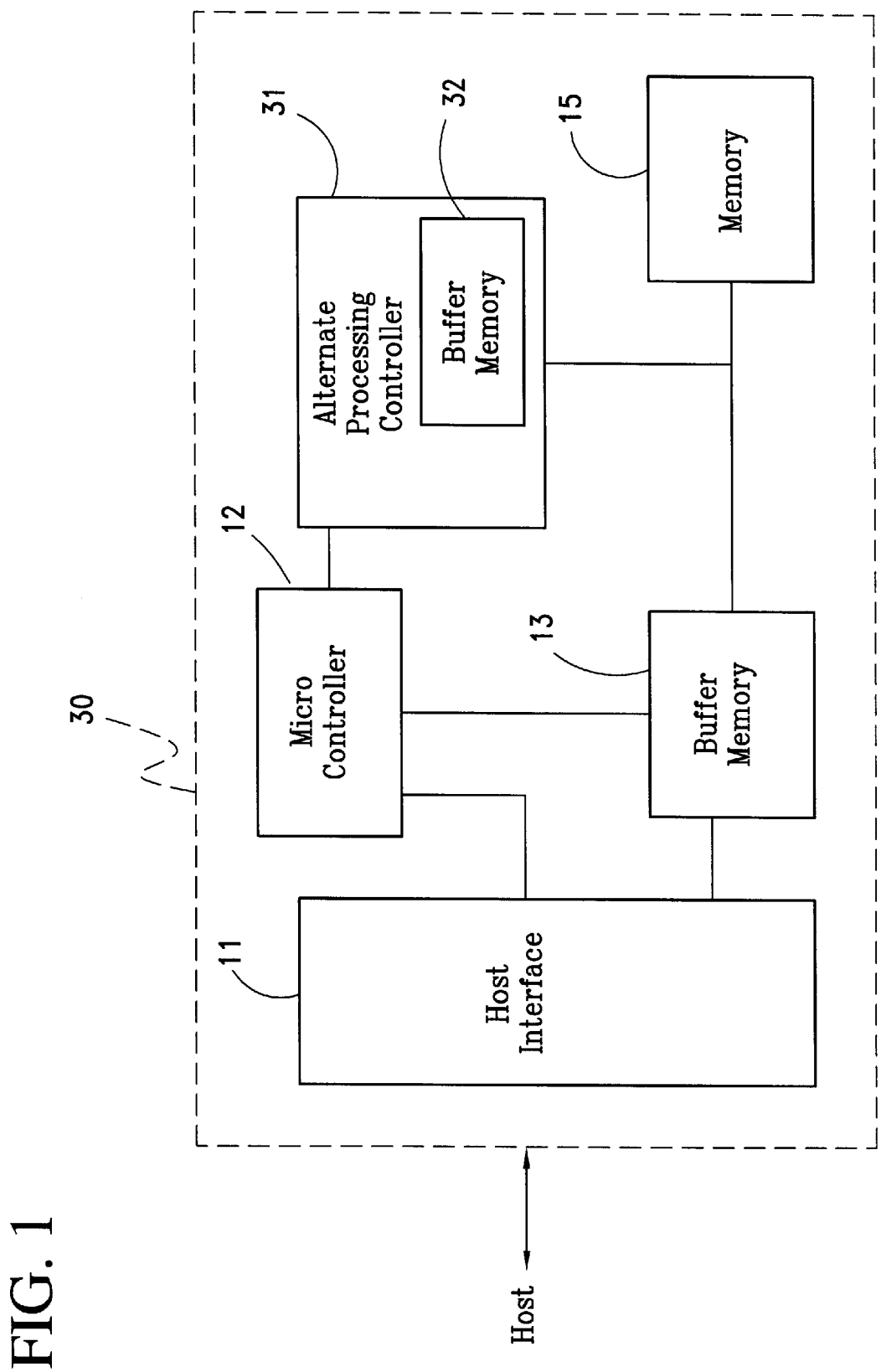
FIG. 1 is a schematic diagram showing a storage device and an alternate processing method for defective sectors of a storage device according to a first preferred embodiment of [a] the present invention.

FIG. 1 is a schematic diagram showing a storage device and an alternate processing method for defective sectors of the storage device according to a first preferred embodiment of a present invention.

As shown in FIG. 1, an external memory 30 is preferably made up of a host interface 11 for connecting to an external host computer, a memory 15, a micro controller 12 for controlling data read and write operations to a memory 15, a buffer memory 13 for storing supplied write data, and an alternate processing controller 31 for performing alternate processing and defective sector checking, and which provides a buffer memory 32 (a data storing unit).

The memory 15 is a non-volatile semiconductor memory with block unit erase only, and is made up of] an EEPROM.

Figure 2:
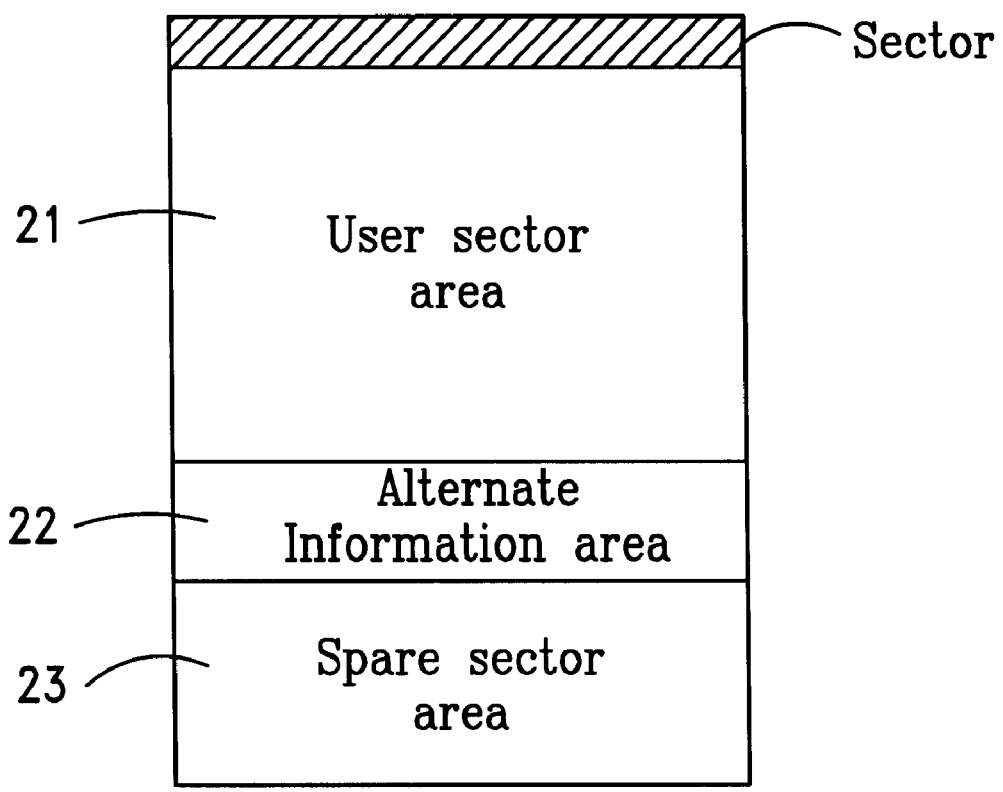
FIG. 2 is a schematic diagram showing a memory layout of the external memory according to the first preferred embodiment.

FIG.2 is a schematic diagram showing a memory layout of the external memory.

As shown in FIG.2, the memory 15 is preferably made up of a user sector area 21 for storing user data, an alternate information area 22 having address information for a defective sector and an alternate sector which is alternated for the defective sector, and a spare sector area 23 for storing data written to the defective sector in the user sector area 21.

The micro controller 12 is a microprocessor for executing a control program, which has a memory storing the control program and data, which executes alternate processing in response to the control program, and which controls all operations for the apparatus.

When the alternate processing controller 31 performs the alternate processing for data which is written to the defective sector, it temporarily stores data to the internal buffer memory 32. After processing all of the data, the alternate processing controller 31 stores at one time a plurality of sector data resulting from performing the alternate processing to the spare sector 23.

Thus, the external memory 30 provides the buffer memory 32 which temporarily stores data when the alternate processing controller 31 checks for a detective sector and performs alternate processing for data which is written to the defective sector. The external memory 30 stores at one time a plurality of the sector data resulting from performing the alternate processing, to the spare sector area 23.

The following describes operations of the storage device and the alternate processing method for the defective sectors of the storage device constructed as mentioned above.

In a write operation in which the external memory 30 writes data from a host, when a plurality of defective sectors exist over a plurality of blocks in a data area which the host writes, the following alternate processing is performed.

(1) When a defective sector is found, data which is written to the defective sector is temporarily stored to the buffer memory 32 in the alternate processing controller 31 with address information of the defective sector.

Normal sectors, other than the defective sector are written to an applicable user sector area 21.

(2) When a next write data exists, the same processing as mentioned above occurs. All data which is written to the defective sector is stored to the buffer memory 32 in the alternate processing controller 31.

(3) When writing of all data which is transferred from the host terminates, alternate data stored to the buffer memory 32 in the alternate processing controller 31 is written in the same block of the spare sector area 23. Further, address information of the defective sector and information of the address which is alternated in the spare sector area 23, are stored to the alternate information area 22 of the memory 15.

As mentioned above, the storage device and the alternate processing method for the defective sectors of the storage device according to the first preferred embodiment is made up of the host interface 11, the micro controller 12 which controls throughout the apparatus, the buffer memory 13 which stores supplied write data, the alternate processing controller 31 which performs the alternate processing and checking of the defective sector, and which has the buffer memory 32, and the memory 15. The memory is made up of the user sector area 21 which stores the user data, the alternate information area 22 which has the address information of the defective sector and the alternate sector which is alternated for the defective sector, and the spare sector area 23 which stores the data which is written to the defective sector on the user sector area 21. When the alternate processing controller 31 performs the alternate processing for data which is written to the detective sector, the data is stored temporarily to the internal buffer memory 32 and the plurality of the sector data resulting from the alternate processing are stored from the buffer memory 32 to the spare sector area 23 at one time. As a result, the inventive method can decrease the number of data write cycles for the alternate processing and can achieve a high speed for the data write operation.

Figure 3:
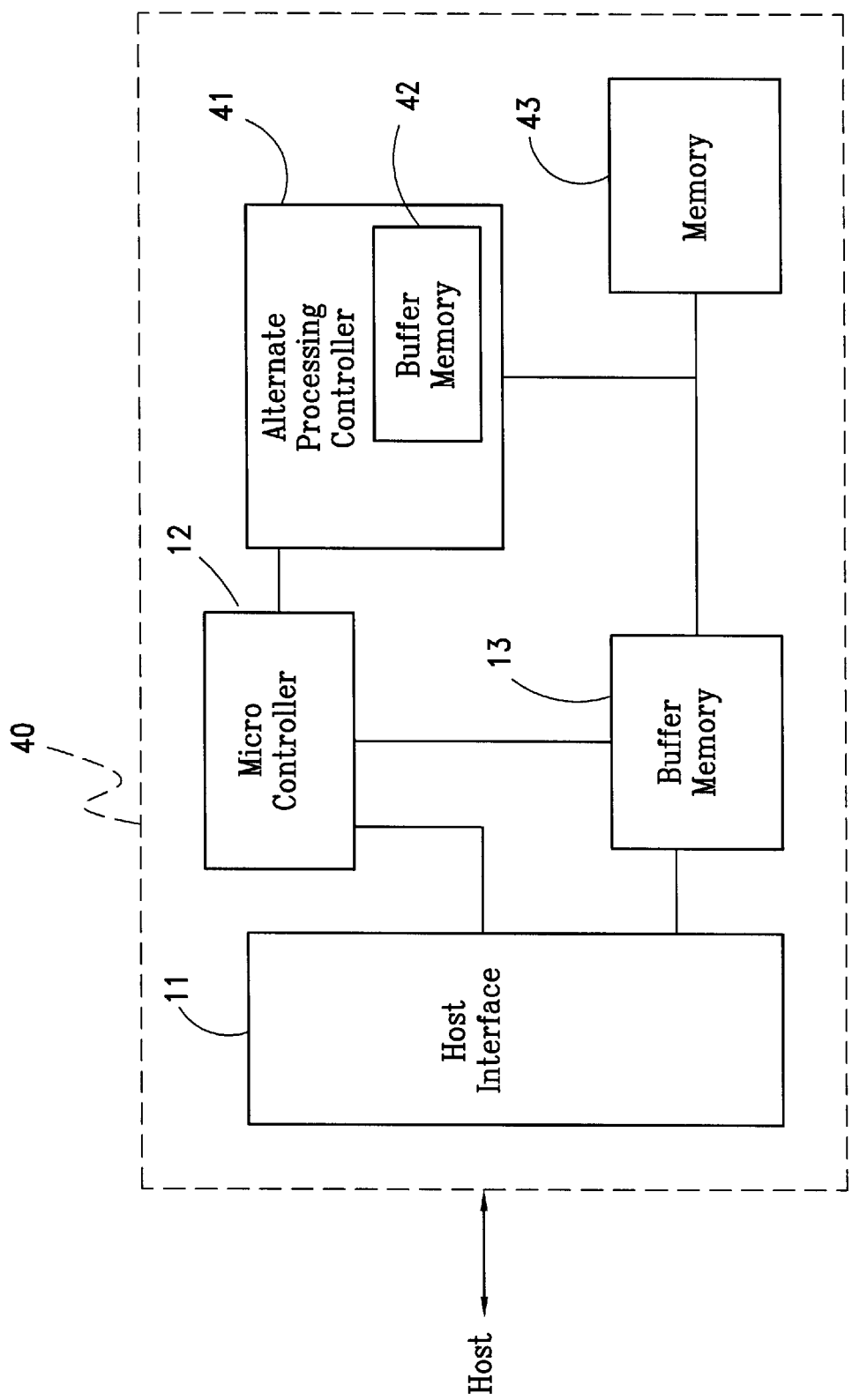
FIG. 3 is a schematic diagram showing a storage device and an alternate processing method for defective sectors of a storage device according to a second preferred embodiment of [a] the present invention.

FIG. 3 is a schematic diagram showing a storage device and an alternate processing method for defective sectors of the storage device according to a second preferred embodiment of the present invention.

As shown in FIG.3, an external memory 40 is preferably made up of a host interface 11 for connecting to an external host computer, a memory 43, a micro controller 12 for controlling data read and write operations to a memory 43, a buffer memory 13 for storing supplied write data, and an alternate processing controller 41 for performing alternate processing and defective sector checking, and which provides a buffer memory 42 (a data storing unit).

When the alternate processing controller 41 performs alternate processing for data which is written to a defective sector, it temporarily stores such data to the buffer memory 42 of the internal memory 43. Further, a plurality of sector data resulting from the alternate processing is stored to spare sector area 23.

The memory 43 is a non-volatile semiconductor memory with block unit erase only, and is made up of an EEPROM.

Figure 4:
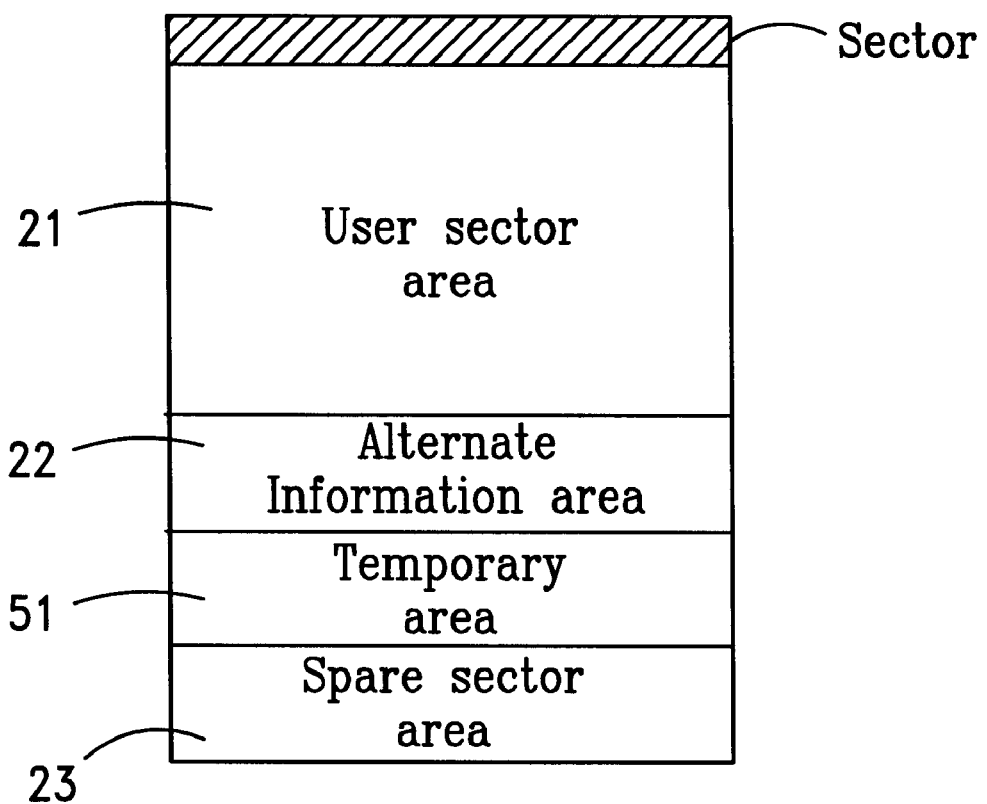
FIG.4 is a schematic diagram showing a memory layout of the external memory according to the second preferred embodiment.

FIG.4 is a schematic diagram showing a layout of memory 43 of the external memory 40.

As shown in FIG. 3, the memory 43 is preferably made up of a user sector area 21 for storing an user data, an alternate information area 22 having an address information for a defective sector and an alternate sector which is alternated for the defective sector, a temporary area 51 for storing temporary blocks including a defective sector, and a spare sector area 23 for storing data written to the defective sector in the user sector area 21.

The temporary area 51 is made up of a plurality of blocks. Here, the number of the sectors included in one block is eight. The temporary area 51 is made up of eight blocks.

The external memory 40 provides the buffer memory 42 for storing data temporarily when the alternate processing controller 41 is performing the alternate processing and the defective sector checking, performs alternate processing for data which is written to the defective sector, and provides the temporary area 51 for temporarily storing a data block, including the defective sector. The external memory 40 stores at one time the data corresponding to a plurality of the defective sector, to the spare sector area 23 using the buffer memory 42 and the temporary area 51.

The following describes operations of the storage device and the alternate processing method for the defective sectors of the storage device constructed as mentioned above.

In a write operation in which the external memory 40 writes data from the host, a block has sectors which are written data from the host, and the block has at least one of the defective sectors. In these circumstances, when data is written to the plurality of the sectors including the defective sectors, the following alternate processing is performed.

When the defective sector is found, the data is not written to a block of the user sector area 21 including the defective sector, but is written to the temporary area 51. The address of the block including the defective sector, the address of a storing area in the temporary area 51, and address information for the defective sector in the block, is stored in the alternate information area 22. Whenever the defective sector is found, the following the alternate processing is performed.

After that, in the operation of the external memory 40, when accessing data in a block including a defective sector of the user sector area 21, the block is stored in the temporary area 51 based on the address information of the alternate information area 22, which is assigned.

Then, when the number of the defective sectors becomes eight sectors (the number of sectors in one block), the normal sectors are stored to the user sector area 21 from the data stored temporarily to the temporary area 51, and the defective sectors are stored to the spare sector area 23 from the data written to the defective sectors stored temporarily to the temporary area 51.

Figure 5:
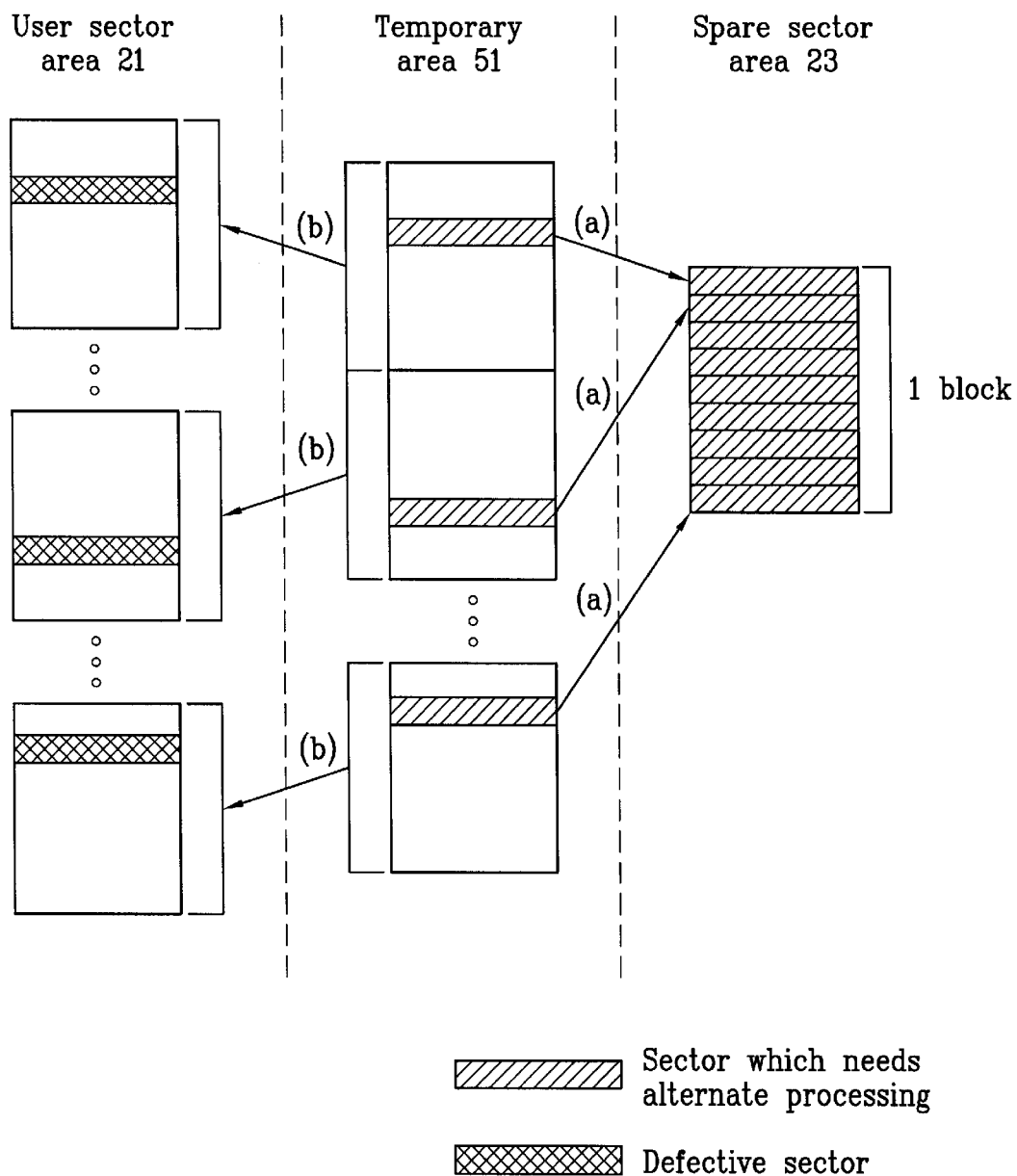
FIG. 5 is a schematic diagram showing the data alternate processing in the temporary area according to the second preferred embodiment.

FIG.5 is a schematic diagram showing the data alternate processing in the temporary area 51.

(1) Data in the temporary area 51 are read every block, in turn.

(2) Only sectors applicable to the defective sector which are detected, are stored to the buffer memory 42 of the alternate processing controller 41.

(3) When all sectors applicable to the defective sector are read, they are stored to the spare sector area 23 as alternate sectors for the defective sectors, as shown in (a) of FIG.5.

(4) Data of each block stored in the temporary area 51 is copied to the user sector area 21, which would be stored there originally. At this time, for the sector which is decided as the defective sector, information about the sector is stored.

(5) An address of the defective sector, an address which is alternated in the spare sector area 23, and information about which data in the temporary area 51 is written to a defective sector, is stored to the alternate information area 22.

After that, when performing the write operation for the block including the defective sector, data is stored temporarily to the temporary area 51, and the same processing as mentioned above is performed.

Accordingly, data which is alternated for the defective sector, can be stored to the spare sector area 23 at one time. Further, the normal sector is stored to the user sector area 21 and the defective sector is stored to the spare sector area 23. The use of this area except for storing the defective sector of the block is avoided.

As mentioned above, the storage device and the alternate processing method for the defective sectors of the storage device according to the second preferred embodiment is made up of the buffer memory 42 which stores data temporarily, the alternate processing controller 41 for performing the alternate processing and the defective sector checking, and which performs the alternate processing for data written to the defective sector, and the temporary area 51 which temporarily stores the block including the defective sector. Since data corresponding to the plurality of the defective sectors are stored to the spare sector area 23 at one time, using the buffer memory 42 and the temporary area 51 can decrease the number of write cycles for the data for the alternate processing and can achieve high for the data write operation.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A storage device comprising:

a first data storing unit storing user data transferred from a host unit;

a memory that receives the user data from the first data storing unit and that has a user sector area, an alternate information area, and a spare sector area, the user sector area storing portions of the user data addressed to non-defective sectors of the memory, the alternate information area storing information identifying a defective sector of the memory and further identifying an alternate sector that is substituted for the defective sector, and the spare sector area storing portions of the user data addressed to the defective sector;

an alternate processing controller that reserves a sector of the spare sector area as the alternate sector for the defective sector and that controls writing of the portions of the user data addressed to the non-defective sectors to sectors of the user sector area; and a second data storing unit that temporarily stores the portions of the user data addressed to the defective sector;

wherein the alternate processing controller controls the temporary storing in the second data storing unit of the portions of the user data that are addressed to the defective sector, and controls writing at one time to the spare sector area of a plurality of sectors of the user data temporarily stored in the second data storing unit.

2. A storage device as claimed in claim 1, wherein the plurality of sectors of user data stored in the memory constitute a block of a predetermined size, and and the memory is erasable only in units of one block each.

3. A storage device as claimed in claim 2, wherein the memory is a non-volatile semiconductor memory.

4. A storage device as claimed in claim 2, wherein the memory is a disk memory.

5. A storage device as claimed in claim 1, wherein the portions of the user data addressed to the defective sector are not stored in the user sector area of the memory, and the number of writing operations to the memory to store the user data does not exceed a predetermined number of writing operations.

6. A storage devices as claimed in claim 1 wherein the second data storing unit is a buffer memory forming part of the alternate processing controller.

7. A storage device comprising:
   an interface buffer storing user data transferred from a host unit;
   a memory that receives the user data from the interface buffer and that has a user sector area, an alternate information area, and a spare sector area, the user sector area storing portions of the user data addressed to non-defective sectors of the memory, the alternate information area storing information identifying a defective sector of the memory and further identifying an alternate sector that is substituted for the defective sector, and the spare sector area storing portions of the user data addressed to the defective sector;
   an alternate processing controller that reserves a sector of the spare sector area as the alternate sector for the defective sector and that controls writing of the portions of the user data addressed to the non-defective sectors to sectors of the user sector area;
      wherein the memory further includes a temporary area for temporarily storing a block of the user data from the interface buffer, including the portions of the user data addressed to the defective sector; and
      wherein the alternate processing controller controls the temporary storing of the block, including the portions of the user data addressed to the defective sector, to the temporary area, and controls the writing at one time to the spare sector area of a plurality of sectors of the user data addressed to defective sectors temporarily stored in the temporary area of the memory.

8. A storage device as claimed in claim 7, wherein the plurality of sectors of user data stored in the memory constitute a block of a predetermined size, and the memory is erasable only in units of one block each.

9. A storage device as claimed in claim 8, wherein the memory is a non-volatile semiconductor memory.

10. A storage device as claimed in claim 8, wherein the memory is a disk memory.

11. A storage device as claimed in claim 7, wherein the portions of the user data addressed to the defective sector are not stored in the user sector area of the memory, and the number of writing operations to the memory to store the user data does not exceed a predetermined number of writing operations.

12. A storage devices as claimed in claim 7, further comprising:
   a buffer memory forming part of the alternate processing controller, in which buffer memory the alternate processing controller temporarily stores the plurality of sectors of the user data addressed to defective sectors, prior to writing them at one time to the spare sector area.

13. An alternate processing method for defective sectors of a storage device, comprising:
   storing in a first data storing unit user data transferred from a host unit storing the user data in a memory that receives the user data from the first data storing unit and that has a user sector area, an alternate information area, and a spare sector area, the user sector area for storing portions of the user data addressed to non-defective sectors of the memory, the alternate information area for storing information identifying a defective sector of the memory and further identifying an alternate sector that is substituted for the defective sector, and the spare sector area for storing the portions of the user data addressed to the defective sector;
   processing the user data using an alternate processing controller that reserves a sector of the spare sector area as the alternate sector for the defective sector, that controls writing of the information identifying the defective sector and the alternate sector to the alternate information area, and that controls writing of the portions of the user data addressed to the non-defective sectors to sectors of the user sector area;
   temporarily storing in a second data storing unit the portions of the user data addressed to the identified defective sector; and
   writing to the spare sector area at one time a plurality of sectors of the user data temporarily stored in the second data storing unit.

14. An alternate processing method for defective sectors of a storage device, comprising:
   storing in an interface buffer user data transferred from a host unit;
   storing the user data in a memory that receives the user data from the interface buffer and that has a user sector area, an alternate information area, a spare sector area, and a temporary sector area, the user sector area for storing portions of the user data addressed to non-defective sectors of the memory, the alternate information area for storing information identifying a defective sector of the memory and further identifying an alternate sector that is substituted for the defective sector, the spare sector area for storing the portions of the user data addressed to the defective sector, and the temporary area for temporarily storing a block of the user data from the interface buffer, including the portions of the user data addressed to the defect sector;
   processing the user data using an alternate processing controller that reserves a sector of the spare sector area as the alternate sector for the defective sector, that controls writing of the information identifying the defective sector and the alternate sector to the alternate information area, and that controls writing of the portions of the user data addressed to the non-defective sectors to sectors of the user sector area;
   storing in the temporary area the block of the user data, including the portions of the user data addressed to the identified defective sector; and
   writing to the spare sector area at one time a plurality of the sectors of the user data addressed to defective sectors that are temporarily stored in the temporary area.

* * * * *